United States Patent [19]

Mermelstein et al.

[11] Patent Number: 5,404,064
[45] Date of Patent: Apr. 4, 1995

[54] LOW-FREQUENCY ELECTROSTRICTIVE CERAMIC PLATE VOLTAGE SENSOR

[75] Inventors: Marc D. Mermelstein, Chevy Chase, Md.; Sandeep T. Vohra, Crofton, Va.

[73] Assignee: The United States of America as represented by the Secretary of the Navy, Washington, D.C.

[21] Appl. No.: 115,063

[22] Filed: Sep. 2, 1993

[51] Int. Cl.⁶ ............................................. H01L 41/08
[52] U.S. Cl. .................... 310/319; 310/318; 310/338; 310/369
[58] Field of Search ............... 310/318, 319, 338, 339, 310/369

[56] References Cited

U.S. PATENT DOCUMENTS

| | | | |
|---|---|---|---|
| 4,220,887 | 9/1980 | Kompanek | 310/334 |
| 4,769,599 | 9/1988 | Mermelstein | 324/244 |
| 5,018,088 | 5/1991 | Higbie | 364/574 |
| 5,086,776 | 2/1992 | Fowler et al. | 128/661.09 |
| 5,170,103 | 12/1992 | Rouch et al. | 318/128 |
| 5,199,004 | 3/1993 | Monahan | 367/157 |
| 5,228,780 | 7/1993 | Shepard et al. | 374/175 |
| 5,243,661 | 9/1993 | Ohkubo et al. | 381/94 |

OTHER PUBLICATIONS

Mermelstein et al., "Low-Frequency Electrostrictive Ceramic Plate Voltage Sensor", Elec. Ltrs., vol. 28, No. 20, pp. 1930-1931, Sep. 92.

Mermelstein, "A Magnetoelastic Metallic Glass Low-Frequency Magnetometer", IEEE Trans. Mag., vol. 28, No. 1, pp. 36-56, Jan. 1992.

Vohra et al., "Fiber-Optic dc and Low-Frequency Electric-Field Sensor", Op. Ltrs., vol. 16, No. 118, pp. 1445-1447, Sep. 1991.

Primary Examiner—Thomas M. Dougherty
Attorney, Agent, or Firm—Thomas E. McDonnell; Charles J. Stockstill

[57] ABSTRACT

A stress-driven electrostrictive ceramic low-voltage plate voltage sensor based on the principle of the field-coupling between the strain and polarization in the ceramic material of the device. Application of a dithering or driving voltage to a piezoelectric tube thereby generating an oscillating polarization whose amplitude is proportional to an applied low-frequency voltage. A electrostrictive ceramic wafer material affixed to the piezoelectric tube senses this oscillation and generates a displacement current. The displacement current represents a voltage output that is an amplitude modulated carrier whose displaced amplitude is proportional to an applied unknown signal voltage sought to be determined.

13 Claims, 2 Drawing Sheets

LOW-FREQUENCY ELECTROSTRICTIVE CERAMIC PLATE VOLTAGE SENSOR

BACKGROUND OF THE INVENTION

1. Field of the Invention

The present invention relates to a low-frequency voltage sensor and more particularly to a stress-driven low-frequency electrostrictive ceramic plate voltage sensor.

2. Description of the Related Art

Field response materials, e.g., magnetostrictive metals and electrostrictive ceramics, are used in sensors.

The measurement of low-frequency magnetic fields utilizing a magnetoelastic amorphous metal low-frequency magnetic field sensors with a magnetostrictive amorphous metal ribbon has been discussed by Mermelstein in the paper entitled *A Magnetoelastic Metallic Glass Low-Frequency Magnetometer*, IEEE Trans. Magn. Vol. 28, No. 1, pp. 36–56, January 1992. This technique is based upon the magnetoelastic interaction between the magnetization and strain in field-annealed amorphous metal ribbons. The magnetoelastic magnetometer has the ability to measure the low-frequency magnetic field and magnetic field gradiants in the presence of other low-frequency perturbations such as temperature and other stress fluctuations.

The principle of operation of the magnetometer is based upon the field-dependent coupling between the magnetization and strain modes in the magnetostrictive amorphous material. It is constructed by interfacing a resonating piezoelectric plate to a field-annealed magnetostrictive amorphous ribbon with a viscous fluid. The piezoelectric plate serves to generate a well-defined stress wave in the ribbon at acoustic frequencies where the viscous fluid transfers the strain in the ceramic to the ribbon.

Also, electrostrictive ceramics have been demonstrated for use in the detection of low-frequency voltages in fiber optic interferometers, as discussed in the paper *Fiber-optic dc and low-frequency electric field sensor*, Vohra et al., Opt. Ltrs., Vol. 16 No. 18, pp. 1445–1447, September 1991. However, they require the use of fiber-optic interferometers to measure low-frequency voltages. Presently, this is the only technology available to measure low-frequency voltages using electrostrictive materials.

SUMMARY OF THE INVENTION

The object of this invention is to provide a device capable of accurately measuring a low-frequency voltage at a lower cost than currently utilized methods.

A further object is to provide a device for filtering out any extraneous noise present on a measured low-frequency voltage.

These and other objects are achieved by a stress-driven electrostrictive ceramic low-voltage plate voltage sensor that is based on the principle of field-coupling between the strain and polarization in the ceramic material of the sensor. Application of a dithering or driving stress in a piezoelectric tube generates an oscillating polarization in an affixed electrostrictive ceramic wafer material whose amplitude is proportional to an applied low-frequency voltage. The oscillating polarization generates an amplitude modulated displacement current which is measured as a voltage drop across a resistor of known value in an electrical circuit.

DESCRIPTION OF THE PREFERRED EMBODIMENT

The principle of operation for the strain-sensitive and current-sensitive sensors is based on the field-dependent coupling between polarization and strain modes in the ceramic plate. The application of this principle, in the embodiment described below, may be used in noise-reduction devices or wherever preamplification and voltage detection is required, and for investigation of the electrostrictive properties of other ceramic materials.

With reference now to the drawings in which like numerals represent like elements throughout the views.

Figure 1:
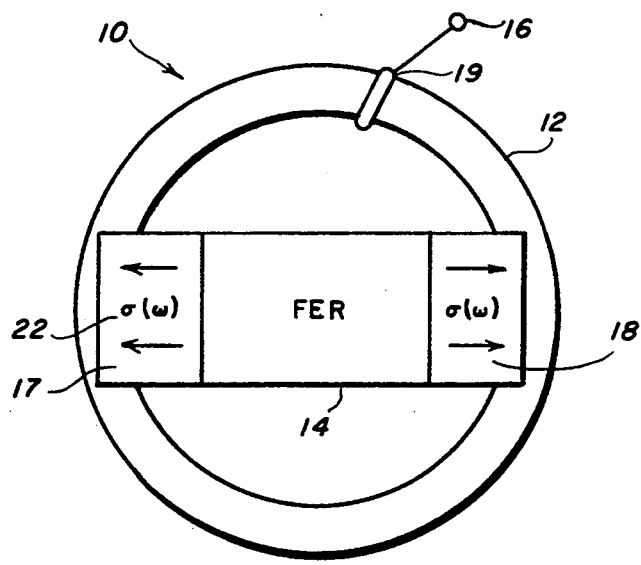
FIG. 1 is a schematic of the electrostrictive ceramic sensor.

The preferred embodiment of a low-frequency electrostrictive ceramic plate voltage sensor 10 is shown in FIG. 1. The electrostrictive ceramic wafer or sensor element 14 may be made of any ferroelectric relaxor wafer material, such as, a barium doped PZT ceramic (lead-zirconium-titanate) or any other electrostrictive material having an electrostrictive coefficient, Q, of between 0.05 farads$^2$/V$^2$ and 0.3 farads$^2$/V$^2$, preferably 0.3 farads$^2$/V$^2$ or as large as possible. A ferroelectric relaxor is any material which can be deformed by an induced electric field thereby producing a voltage, such materials are well known to individuals practicing the art. The electrostrictive ceramic wafer 14, in the preferred embodiment, for example, has a dimension of 7.5 mm $\times$ 10 mm $\times$ 1 mm, with a film of conductive material forming electrodes or electrical connections 22 and 23, such as, gold (Au), deposited on the two facets 17 and 18 of the wafer 14. The wafer 14 is affixed to circular tube 12, having an inner and outer surface, made of a piezoelectric material, such as, PZT 5H, or equivalent, manufactured by Aura Ceramics of New Hope, Minn. The piezoelectric tube 12 is, for example, approximately 50 mm long with an outer diameter of approximately 25.4 mm and a thickness of one mm, however, it may be of any desired interior and exterior dimension or length. The preferred means of affixing the wafer 14 to the piezoelectric tube 12 is a non-conducting epoxy, such as, any "five-minute", or equivalent, commercial grade, non-conducting epoxy, which is well known to those practicing in the art. In the operation of the invention, an oscillating voltage, dither or drive voltage 16 is applied to the opposing end of the piezoelectric tube 12 from the wafer 14, through an electrical connection 19. However, the oscillating stress generating mechanism (piezo-electric driver) does not have to have cylindrical geometry it can be rectangular, oval or any other two wall shape.

The source of the oscillating voltage may be a signal generator, such as a HP 3526A Frequency Synthesizer, manufactured by Hewlett-Packard Co. of Santa Clara, Calif. Application of the oscillating voltage causes the dimensions of the outside diameter of the piezoelectric tube 12 to change in dimension during oscillation. Such changes in dimensions are transferred to the electrostrictive ceramic wafer 14, thereby generating a dynamic longitudinal stress, $\sigma(\omega)$. Eq. (1) shows that an oscillating longitudinal stress in the electrostrictive ceramic wafer 14 at a frequency, $\omega$, generates a polarization, $P(\omega)$, normal to the wafer 14 which is given by the formula $P(\omega) = -[a\chi/C]\sigma(\omega)$.

$$\begin{bmatrix} P \\ e \end{bmatrix} = \begin{bmatrix} \chi & -\frac{\chi a}{C} \\ -\frac{\chi a}{C} & C^{-1} \end{bmatrix} \begin{bmatrix} E \\ \sigma \end{bmatrix} \quad (1)$$

where $a = a_O + 2CQ\chi <V^s>/h$ is an effective field-dependent piezoelectric constant, P is the polarization, E is the electric field, $\sigma$ is the stress, e is the strain, C is the longitudinal elastic modulus, $<V_s>$ is the low-frequency signal voltage which is assumed to be very small, Q is the electrostriction coefficient, and h is the plate thickness. The off-diagonal matrix elements in Eq. (1) determine the polarization response to stress driving the strain response to voltage driving.

A phenomenological potential energy density function for the electrostrictive ceramic wafer 14 is given by the equation:

$$U = \tfrac{1}{2}\chi^{-1}P^2 + a_O eP + CQeP^2 + \tfrac{1}{2}Ce^2 \quad (2)$$

where $\chi$ is the dielectric susceptibility, and $a_O$ is the piezoelectric coefficient. The electric field, E, and the stress, $\sigma$, in the electrostrictive ceramic 14 are given by the partial derivatives of U with respect to the polarization, P, and strain, e. This energy density function represents a spatial average for a sample that is predominately electrostrictive with some regions exhibiting piezoelectricity. Therefore, the piezoelectric coupling is assumed to be weak. Eq. (2) will lead to the susceptibility for the coupled polarization and strain as shown in Eq. (1).

The stress applied by the piezoelectric tube 12 may be approximated by the formula $\sigma(\omega) = C'dV_d(\omega)/h'$, where C' is the Young's modulus of the piezoelectric tube 12, d is the piezoelectric coefficient, h' is the piezoelectric tube 12 thickness and $V_d(\omega)$ is the dither voltage 16. The rms stress, $\sigma_{rms}$, for a device utilizing an electrostrictive ceramic wafer 14 made of barium-lead-zirconium-titanate (PZT) material is estimated to be $5.1 \times 10^4$ N/m² for the parameter values listed in Table 1, where h' is the wall thickness of the piezoelectric tube 12, h, the thickness of the barium-PZT ceramic material, $\epsilon_O$ the permativity of free space, d, the piezoelectric coefficient, C the longitudinal elastic modulus of barium-PZT ceramic wafer 14, $\omega_O/2\pi$ the frequency of the dithering voltage 16, C' the Young's modulus of the piezoelectric tube 12, R the resistance of a resistor, R, (described below), and $V_d$ the drive voltage 16 applied by dithering to the piezoelectric tube 12. The fluctuating polarization in the electrostrictive ceramic wafer 14 generates a displacement current, $i(\omega) = -j\omega A P(\omega)$, where A is the electrostrictive ceramic wafer 14 surface area, P is polarization and $j = \sqrt{-1}$. This displacement current is measured with the circuit 20 shown in FIG. 2.

Figure 2:
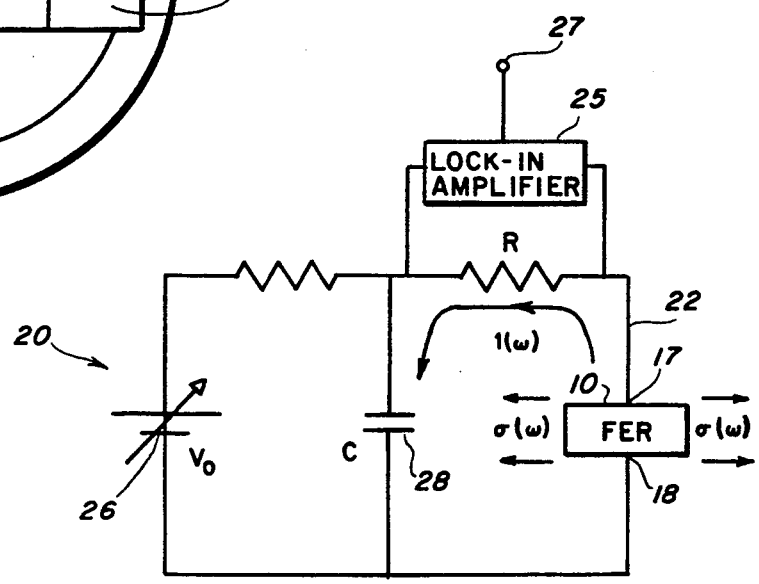
FIG. 2 is a schematic of the simple electrical circuit for measuring the output of the electrostrictive sensor.

The output of the electrostrictive ceramic wafer 14 is measured by the voltage drop, $V(\omega)$, across a resistor, R, in the circuit shown in FIG. 2, as determined by the equation $$V(\omega) = \frac{-2j\omega AR Q\chi^2}{h}[V_o + <V_s>]\sigma(\omega) \quad (3)$$

where the piezoelectric offset voltage is $V_O = a_O h/2CQ\chi$. A lock-in amplifier 25, such as, a Model 5210, manufactured by EG&G of Princeton, N.J., measures the rms carrier amplitude of the voltage drop across resistor R, which is an amplitude modulated carrier whose displaced amplitude is proportional to the signal voltage, $<V_s>$. Further, the lock-in amplifier 25 is used to demodulate the signal voltage, $<V_s>$, producing the output 27 given by the formula $V_{rms} = \eta |<V_s> + V_O|$, where the sensitivity is defined by as $\eta = 2\omega AR\chi^2 Q\sigma_{rms}/h$.

TABLE 1

| Material and Device Parameters | |
| --- | --- |
| $\chi = 4 \times 10^3 \times \epsilon_0$ | h' = 2 mm |
| $\epsilon = 8.85 \times 10^{-12}$ F/m | h = 1 mm |
| $d = 171 \times 10^{-12}$ n/V | Q = 0.3 m⁴/C² |
| $C = 6.1 \times 10^{10}$ N/m² | $C' = 6.0 \times 10^{10}$ N/m² |
| $\omega_0/2\pi = 40$ kHz | R = 1.0 kΩ |
| $\sigma_{rms} = 5.1 \times 10^{10}$ N/m² | $V_d = 10$ V |

Figure 3:
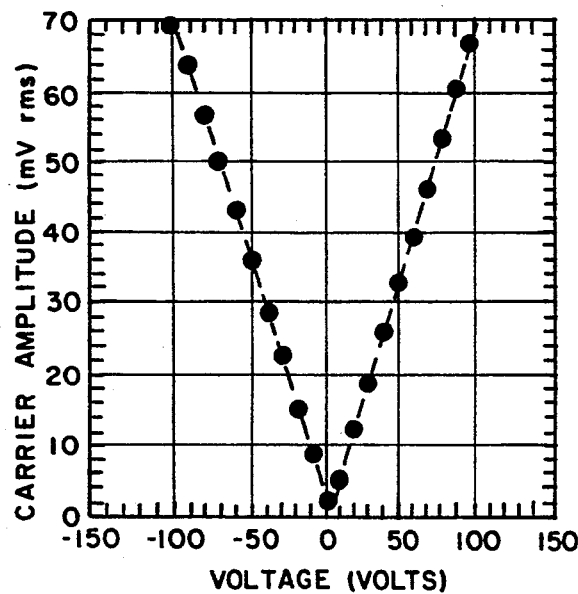
FIG. 3 is a plot of the rms voltage drop across a resistor, R, as a function of bias voltage in the electrical circuit for measuring the output of the electrostrictive sensor.

FIG. 3 shows a typical plot of the signal voltage as a function of applied dc voltage 26 for the low-frequency electrostrictive ceramic plate voltage sensor 10 with the parameters as shown in Table 1. The dashed line is a nonlinear least squares fit to the trial function $V_{rms} = \eta|<V_s> - V_O|$, where $\eta$ is the sensitivity and $V_O$ is the offset field attributed to the piezoelectric effect. The fitting routine yields a $\eta = 0.68$ mV/V and $v_O = 2.6$ V. It is seen that the signal voltage exhibits good linearity in the indicated voltage range. The slope of the plot yields a sensitivity of 0.68 mV/V in good agreement with the calculated value of 0.51 mV/V based on the material and device parameters listed in Table 1. The offset voltage is found to be 2.6 V, which yields a piezoelectric coefficient, $a_O$, of $3.4 \times 10^6$ V/m.

The minimum detectable field of the low-frequency electrostrictive ceramic plate voltage sensor 10 is determined by measuring the signal voltage power spectral density (PSD) corresponding to the amplitude output of the lock-in amplifier 25. The signal voltage PSD is measured using a dynamic signal analyzer, such as, a HP 3562A, manufactured by Hewlett-Packard Co. of Santa Clara, Calif., in the 0 to 10 Hz bandwidth. The voltage equivalent noise is given by the formula $V_{s,rms} = V_{rms}/\eta G$, where $G = 10^3$ is the lock-in amplifier 25 gain. This expression is evaluated to yield a minimum detectable field of 1.4 mV/√Hz for $\eta = 0.68$ mV/V under the aforementioned conditions shown in Table 1.

Figure 4:
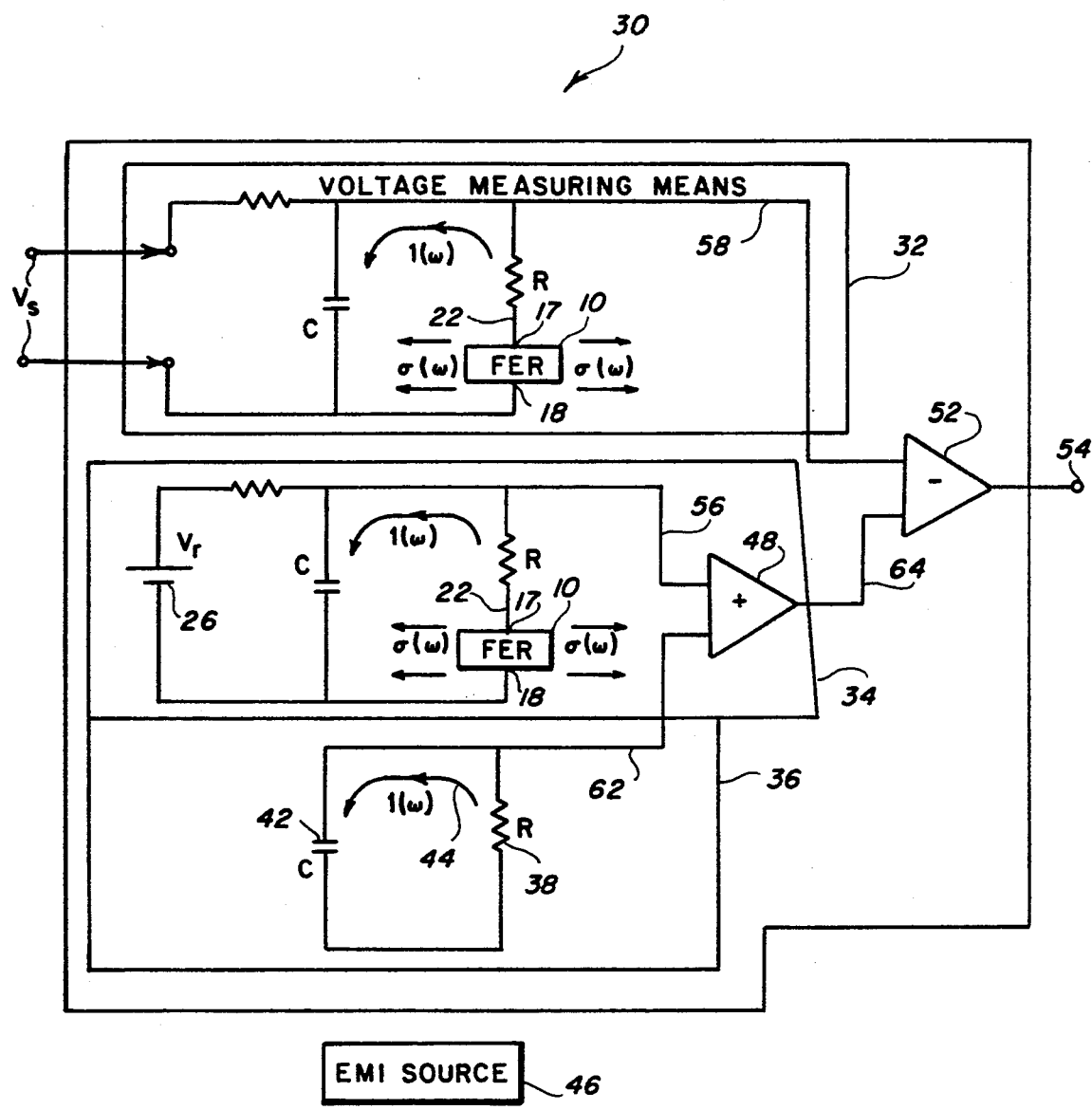
FIG. 4 is a schematic of a common mode rejection embodiment for noise reduction utilizing the electrostrictive ceramic sensor.

A typical application of the low-frequency electrostrictive ceramic plate voltage sensor 10 is shown in FIG. 4. A noise reduction circuit 30 to enhance the signal-to-noise ratio of a detector (not shown) applies the low-frequency electrostrictive ceramic plate voltage sensor 10 to commonly known rejection techniques to provide a relatively noise-free output voltage.

A voltage, $V_s$, to be measured is input a measurement module 32 comprised of a low-frequency electrostrictive ceramic plate voltage sensor 20. The voltage, $V_s$, which normally contains two elements of noise—thermal and electromagnetic noise—is measured by an electrostrictive ceramic sensor circuit 20, as described above, and applied to a first differential amplifier 52 operating as a subtractor.

As the temperature of the environment changes, a thermal noise is present in the voltage source, $V_s$, and is measured in a reference module 34. This is accomplished by applying a known reference voltage 26 to a electrostrictive ceramic plate voltage sensor circuit 20, as described above. The measurement of the reference voltage 26 containing the quantum of the thermal noise present is then applied to a second differential amplifier.

Any electromagnetic interference (EMI) present upon the input voltage, $V_s$, is detected by a capacitor 42 in an electromagnetic interference detector module 36. This capacitor 42 senses any electromagnetic field present from an external electromagnetic source 46 and generates a voltage signal 44. This voltage signal 44 is applied to the second differential amplifier 48, which acts as an adder, to combine the EMI noise with the voltage generated by the thermal noise in the reference module 34. If there is no EMI present this figure will be zero.

The output 64 of the second differential amplifier 48 is applied to the first differential amplifier 62, where the combined reference voltage/EMI module voltage 64, is subtracted from the measured input voltage 58 and a filtered voltage is provided as an output 54.

The noise floor of the electrostrictive low-frequency ceramic plate voltage sensor 10 is determined by the large temperature sensitivity of the residual piezoelectric coefficient $a_O$ particular to the composition used and a careful selection of the composition can remove this effect resulting in an accompanying reduction of noise floor. The sensor 10 is operated at a relatively low driving stress, $\sigma_{rms}$, which is limited by the Joule heating of the piezoelectric tube. Application of large driving stresses will increase the sensitivity, thereby reducing the minimum detectable voltage. Reduction of the plate thickness of the ceramic wafer 14 will further increase the sensitivity (see Eq. (3)), thereby improving the sensitivity and minimum detectable voltage. This is accomplished at a lower cost than the existing methods utilizing fiber-optic interferometers.

This specification sets forth the preferred embodiments of the low-frequency electrostrictive ceramic plate voltage sensor. For devices other than that specified in the preferred embodiment, other individuals skilled in the art may be required to engineer the specific values of the components, such as, the differential amplifier to minimize the noise, the dithering voltage, etc., to meet the requirements of the voltage range sought to be detected in their particular application. There are numerous trade-offs between the dimensions of the piezoelectric tube, the dithering voltage, the resonance of the piezoelectric tube, etc., which are generated by the geometry of the piezoelectric tube; and the composition of the electrostrictive ceramic wafer that can be made. The main consideration in the construction of this invention is the maximization of the sensitivity of the device. It is also realized that individuals skilled in the art may visualize many other methods for achieving the same result, but the scope of the invention is as set forth in the claims.

What is claimed is:

1. A low-frequency electrostrictive ceramic plate voltage sensor comprised of:
   a piezoelectric tube having an inner and outer surface and a first and second end;
   an electrostrictive ceramic wafer affixed to the first end of the piezoelectric tube;
   means to generate oscillations within the piezoelectric tube attached to the second end of the piezoelectric tube; and
   means for measuring an electric-field-dependent stress induced polarization generated within the electrostrictive ceramic wafer resulting from said oscillations generated within the piezoelectric tube, said stress generating an output voltage having a displaced amplitude proportional to a signal voltage sought to be measured.

2. A plate voltage sensor, as in claim 1, wherein the electrostrictive ceramic wafer is comprised of a lead-magnesium-niobate material.

3. A plate voltage sensor, as in claim 1, wherein said electrostrictive ceramic wafer is comprised of barium doped ceramic lead-zirconium-titanate material.

4. A plate voltage sensor, as in claim 1, wherein the electrostrictive ceramic wafer material is selected from a group consisting of a lead-magnesium-niobate and barium doped ceramic lead-zirconium-titanate.

5. A plate voltage sensor, as in claim 1, wherein said oscillations within the piezoelectric tube are generated by a signal generator.

6. A plate voltage sensor, as in claim 1, wherein said means for measuring the stress generated within the electrostrictive ceramic wafer is an electrical circuit.

7. A device for measuring the low-frequency voltages comprised of:
   a piezoelectric tube having an inner and outer surface and a first and second end;
   an electrostrictive ceramic wafer affixed to the first end of the piezoelectric tube;
   an oscillation applied to the second end of the piezoelectric tube to generate forces within the piezoelectric tube; and,
   an electrical circuit to measure forces generated within the electrostrictive wafer that appear as an amplitude modulated carrier whose displaced amplitude is proportional to an input voltage $<V_O>$ as determined by the equation $$V(\omega) = \frac{-2j\omega ARQ\chi^2}{h} [V_o + <V_s>]\sigma(\omega).$$

8. A noise reducer for low-frequency voltages comprised of:
   a piezoelectric tube;
   means for applying an input voltage comprised of an oscillating voltage having a thermal noise component and an electromagnetic noise component induced by an external electromagnetic interference source superimposed upon the input voltage to the piezoelectric tube;
   means for measuring the input voltage to determine a measured input voltage;
   means for referencing the input voltage to provide a quantum of the thermal noise present upon the input voltage by applying a known reference voltage to the input voltage;
   means for detecting electromagnetic noise component comprising an electronic circuit capable of sensing the electromagnetic noise component induced by the external electromagnetic interference source;

means for combining the quantum of thermal noise determined by the means for referencing the input voltage and the electromagnetic noise component detected by the means for detecting electromagnetic noise means to provide a composite noise signal comprising a total of the thermal noise component and the electromagnetic noise component found on the input voltage; and means for subtracting the composite noise signal from the measured input signal to provide a filtered output signal.

9. A noise reducer, as in claim 8, wherein said means for measuring the input voltage with the superimposed thermal and electromagnetic noise components is a low-frequency electrostrictive ceramic plate voltage sensor comprised of a piezoelectric tube having an inner and outer surface and a first and second end; an electrostrictive ceramic wafer affixed to a first end of the piezoelectric tube; means for generating oscillations within the piezoelectric tube attached to a second end of the piezoelectric tube; means for measuring a stress generated within the electrostrictive ceramic wafer resulting from the oscillations generated within the piezoelectric tube; and means for measuring a voltage generated by the stresses generated within the electrostrictive ceramic wafer resulting from the oscillations generated within the piezoelectric tube.

10. A noise reducer, as in claim 8, wherein said means for referencing the input voltage is a low-frequency electrostrictive ceramic plate voltage sensor comprised of a piezoelectric tube having an inner and outer surface and a first and second end, and an electrostrictive ceramic wafer affixed to the first end of the piezoelectric tube; means for generating oscillations within the piezoelectric tube attached to the second end of the piezoelectric tube capable of generating a stress in the piezoelectric tube; means for measuring the stress generated within the electrostrictive ceramic wafer resulting from the oscillations generated within the piezoelectric tube; and means for measuring the magnitude of a voltage generated by the stress generated within the electrostrictive ceramic wafer resulting from the oscillations generated within the piezoelectric tube.

11. A method comprised of the steps:

generate oscillations within a piezoelectric tube so as to cause an electric-field-dependent stress induced polarization to be produced in an electrostrictive ceramic wafer; and measure a voltage output by the electrostrictive ceramic wafer resulting from the electric-field-dependent stress induced polarization generated therein by the oscillations generated within the piezoelectric tube.

12. A method for reducing noise in low voltage circuits comprising the steps of:

apply an oscillating input signal to a first low-frequency electrostrictive ceramic plate voltage sensor to obtain an output signal an electric-field-dependent stress induced polarization representing the input signal containing a true voltage and an induced noise;

measure a quantum of thermal noise present in the induced noise present on the input signal utilizing a second low-frequency electrostrictive ceramic plate sensor acting as a reference;

measure a noise generated by an electromagnetic field present from an external electromagnetic source capable of inducing noise onto the input signal;

add the thermally induced noise measured by the second low-frequency electrostrictive ceramic plate sensor to the electromagnetic noise of the electromagnetic field so as to provide a total noise signal representing the quantum of noise present on the input signal; and subtract the total noise signal from the output signal of the first low-frequency electrostrictive ceramic plate sensor to obtain a filtered output signal representing the input signal free of noise.

13. An apparatus comprised of:

a piezoelectric tube;

an electrostrictive ceramic wafer;

means for generating oscillations within the piezoelectric tube so as to cause an electric-field-dependent stress induced polarization to be produced in the electrostrictive ceramic wafer; and means for measuring a voltage output by the electrostrictive ceramic wafer as a result of the electric-field-dependent stress induced polarization generated in the electrostrictive wafer.

* * * * *